(12) United States Patent
Kim et al.

(10) Patent No.: US 8,623,724 B2
(45) Date of Patent: Jan. 7, 2014

(54) METHOD OF MANUFACTURING A SEMICONDUCTOR DEVICE INCLUDING A CAPACITOR ELECTRICALLY CONNECTED TO A VERTICAL PILLAR TRANSISTOR

(75) Inventors: Hui-Jung Kim, Seoul (KR); Yong-Chul Oh, Suwon-si (KR); Jae-Man Yoon, Hwaseong-si (KR); Hyun-Woo Chung, Seoul (KR); Hyun-Gi Kim, Hwaseong-si (KR); Kang-Uk Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/547,318

(22) Filed: Jul. 12, 2012

(65) Prior Publication Data

US 2012/0276698 A1    Nov. 1, 2012

Related U.S. Application Data

(63) Continuation of application No. 12/728,596, filed on Mar. 22, 2010, now Pat. No. 8,247,856.

(30) Foreign Application Priority Data

Mar. 26, 2009    (KR) .................. 10-2009-0025979

(51) Int. Cl.
*H01L 21/8242* (2006.01)
(52) U.S. Cl.
USPC .................................. 438/239; 257/E27.016

(58) Field of Classification Search
USPC ................ 257/296, 329, 330, 334, 306–310, 257/E27.016, E29.262, E21.41; 438/239
See application file for complete search history.

(56) References Cited

U.S. PATENT DOCUMENTS

| | | | |
|---|---|---|---|
| 6,337,497 B1 * | 1/2002 | Hanafi et al. | 257/306 |
| 2005/0156180 A1 * | 7/2005 | Zhang et al. | 257/79 |
| 2007/0080385 A1 * | 4/2007 | Kim et al. | 257/296 |

* cited by examiner

*Primary Examiner* — Selim Ahmed
(74) *Attorney, Agent, or Firm* — F. Chau & Associates, LLC

(57) ABSTRACT

A semiconductor device includes a first transistor, a second transistor, an insulation interlayer pattern and a capacitor. The first transistor is formed in a first region of a substrate. The first transistor has a pillar protruding upwardly from the substrate and an impurity region provided in an upper portion of the pillar. The second transistor is formed in a second region of the substrate. The insulation interlayer pattern is formed on the first region and the second region to cover the second transistor and expose an upper surface of the pillar. The insulation interlayer pattern has an upper surface substantially higher than the upper surface of the pillar in the first region. The capacitor is formed on the impurity region in the upper portion of the pillar and is electrically connected to the impurity region.

9 Claims, 7 Drawing Sheets

SECOND REGION(PA)   FIRST REGION(CA)

METHOD OF MANUFACTURING A
SEMICONDUCTOR DEVICE INCLUDING A
CAPACITOR ELECTRICALLY CONNECTED
TO A VERTICAL PILLAR TRANSISTOR

CROSS-REFERENCE TO RELATED PATENT
APPLICATION

This application is a continuation application of U.S. application Ser. No. 12/728,596 filed Mar. 22, 2010 now U.S. Pat. No. 8,247,856, which claims priority under 35 U.S.C. §119 to Korean Patent Application No. 10-2009-0025979, filed on Mar. 26, 2009, the disclosures of which are each hereby incorporated by reference herein in their entireties.

BACKGROUND

1. Technical Field

Example embodiments relate to a semiconductor device and to a method of manufacturing the semiconductor device. More particularly, example embodiments relate to a semiconductor device including a transistor having a vertical channel region and a capacitor connected to the vertical channel region, and to a method of manufacturing the same.

2. Discussion of the Related Art

Recently, as semiconductor devices have become more highly integrated, a transistor structure including a vertical channel region having a small horizontal area where a source/drain region is formed in a vertical direction relative to a substrate has been researched. An impurity region of the vertical channel transistor is electrically connected to a wiring or a capacitor.

On the other hand, the vertical channel transistors and other type transistors such as a planar type transistor may be formed together in the substrate. However, it may be difficult to form the different type transistors together in the substrate. In particular, because there may exist a height difference between a surface of the substrate where the vertical channel transistors are formed and a surface of the substrate where the planar type transistors are formed, it may be difficult to increase the height of the capacitor substantially that is connected to the vertical channel transistor and consequently it may also be difficult to ensure a required high capacitance of the capacitor.

Thus, there is a need in the art for a semiconductor device including a capacitor that is connected to a vertical channel transistor, wherein the capacitor has an improved high capacitance and for a method of manufacturing the same.

SUMMARY

Example embodiments may provide a semiconductor device including a capacitor that is connected to a vertical channel transistor, wherein the capacitor has an improved high capacitance.

Example embodiments may also provide a method of manufacturing the semiconductor device.

According to some example embodiments, a semiconductor device includes a first transistor, a second transistor, an insulation interlayer pattern and a capacitor. The first transistor is formed in a first region of a substrate, the first transistor having a pillar protruding upwardly from the substrate and an impurity region provided in an upper portion of the pillar. The second transistor is formed in a second region of the substrate. The insulation interlayer pattern is formed on the first region and the second region to cover the second transistor and expose an upper surface of the pillar. The insulation interlayer pattern has an upper surface substantially higher than the upper surface of the pillar in the first region. The capacitor is formed on the impurity region in the upper portion of the pillar and is electrically connected to the impurity region.

In an example embodiment, an upper surface of the impurity region may be substantially coplanar with an upper surface of the substrate in the second region.

In an example embodiment, the insulation interlayer pattern may have an opening that selectively exposes a portion of the first region where the pillar is formed.

In an example embodiment, the capacitor may include a lower electrode directly contacting the impurity region of the exposed pillar, a dielectric layer formed on the entire outer surface of the lower electrode, and an upper electrode formed on the dielectric layer.

In an example embodiment, the first transistor may include the pillar protruding upwardly from the substrate in the first region, a first gate insulation layer formed on a sidewall of the pillar, a first gate electrode formed on the first gate insulation layer, a first impurity region formed under a lower portion of the pillar, and a second impurity region formed in the upper portion of the pillar.

In an example embodiment, the pillar may be arranged in a first direction and the first gate electrode may extend in a second direction different from the first direction.

In an example embodiment, the semiconductor device may further include a first isolation layer pattern in the first region of the substrate.

In an example embodiment, the second transistor may include a second gate insulation layer pattern formed on the substrate in the second region, a second gate electrode formed on the second gate insulation layer pattern, and third and fourth impurity regions formed in the substrate of the second region in both sides of the second gate electrode.

In an example embodiment, the semiconductor device may further include a second isolation layer pattern in the first region of the substrate.

According to some example embodiments, in a method of manufacturing a semiconductor device, a substrate having a first region and a second region is prepared. A pillar is formed to protrude upwardly from the substrate in the first region. A first transistor having an impurity region in an upper portion of the pillar is formed. A second transistor is formed in the second region of the substrate. An insulation interlayer pattern is formed on the first region and the second region to cover the second transistor and expose an upper surface of the pillar. The insulation interlayer pattern has an upper surface substantially higher than the upper surface of the pillar in the first region. A capacitor is formed on the impurity region in the upper portion of the pillar and electrically connected to the impurity region.

In an example embodiment, an upper surface of the impurity region of the first transistor may be substantially coplanar with an upper surface of the substrate in the second region.

In an example embodiment, the forming of the insulation interlayer pattern may include forming an insulation interlayer on the first and second regions to cover the first and second transistors, and patterning the insulation interlayer to form the insulation interlayer pattern having an opening that selectively exposes a portion of the first region where the pillar is formed.

In an example embodiment, the forming of the capacitor may include forming a lower electrode directly contacting the impurity region of the exposed pillar, forming a dielectric layer on the entire outer surface of the lower electrode, and forming an upper electrode on the dielectric layer.

In an example embodiment, the method may further include forming a first trench isolation layer pattern and a second trench isolation layer pattern in the first region and the second region, respectively.

In an example embodiment, the forming of the first transistor may include forming the pillar protruding upwardly from the substrate in the first region, forming a first gate insulation layer on a sidewall of the pillar, forming a first gate electrode on the first gate insulation layer, and forming the impurity region in the upper portion of the pillar.

In an example embodiment, the forming of the pillar may include growing a single-crystalline silicon pillar upwardly from the substrate in the first region. The single-crystalline silicon pillar may be formed by a selective epitaxial growth process or a laser-induced epitaxial growth process.

In an example embodiment, the pillar may be arranged in a first direction and the first gate extends in a second direction different from the first direction.

In an example embodiment, the method may further include implanting impurity ions into the surface of the substrate in the first region to form a buried bit line.

As mentioned above, a semiconductor device includes a vertical pillar transistor in a first region of a substrate and a planar type transistor in a second region of the substrate. The vertical transistor has a pillar in a first region of a substrate and an impurity region in an upper portion of the pillar. An insulation interlayer pattern is formed on the first region and the second region to cover the planar type transistor in the second region and expose an upper surface of the pillar in the first region. The upper insulation interlayer pattern has an upper surface substantially higher than the upper surface of the pillar.

A lower electrode directly contacts the impurity region in the exposed pillar, and a dielectric layer is formed on the entire outer surface of the lower electrode. An upper electrode is formed on the dielectric layer to form a capacitor that is electrically connected to the impurity region. Accordingly, the dielectric layer is formed on the entire outer surface including an outer lower surface of the lower electrode, to thereby increase the height of the capacitor substantially and improve a capacitance of a resultant capacitor.

In accordance with another example embodiment, a semiconductor device is provided. The semiconductor device includes a semiconductor substrate including a first region and a second region, a plurality of vertical pillar transistors formed in the first region of the semiconductor substrate, wherein the plurality of vertical pillar transistors each include a pillar, a first gate insulation layer provided on a sidewall surface of the pillar, a first gate electrode provided on the first gate insulation layer, an impurity region provided in an upper portion of the pillar which protrudes from the first gate electrode.

The semiconductor device further includes a plurality of planar type transistors provided on an upper surface of the substrate in the second region of the substrate, wherein each of the planar type transistors includes a second gate structure having a second gate insulation layer pattern, a second gate electrode, a mask pattern stacked on a surface of the substrate in the second region, and a source/drain under a surface of the substrate in both sides of the second gate structure. Moreover, the semiconductor device also includes an upper insulation interlayer pattern formed on the first region and the second region in the substrate, wherein the upper insulation layer pattern covers the planar type transistors in the second region and exposes upper surfaces of the pillars in the first region through an opening in the upper insulation interlayer pattern and wherein an upper surface of the upper insulation interlayer pattern in the second region is substantially higher than an upper surface of the impurity region in the upper portion of the pillar in the first region of the substrate. Further, the semiconductor device also includes a first wiring penetrating the upper insulation interlayer pattern and electrically connected to an end portion of the first gate electrode of the vertical pillar transistor, a second wiring penetrating the upper insulation interlayer pattern and electrically connected to the second gate electrode, and a third wiring penetrating the upper insulation interlayer pattern and electrically connected to the source/drain. In addition, the semiconductor device includes a capacitor electrically connected to the impurity region of the vertical pillar transistor in the first region of the substrate, wherein the capacitor includes a lower electrode which directly contacts the impurity region in the upper portion of the pillar exposed by the upper insulation interlayer pattern, a dielectric layer formed on substantially an entire outer surface of the lower electrode and an upper electrode formed on the dielectric layer.

BRIEF DESCRIPTION OF THE DRAWINGS

Example embodiments will be more clearly understood from the following detailed description taken in conjunction with the accompanying drawings. FIGS. 1 to 5D represent non-limiting, example embodiments as described herein.

FIG. 1 is a cross-sectional view illustrating a semiconductor device in accordance with an example embodiment.

FIGS. 2 to 13 are cross-sectional views illustrating a method of manufacturing a semiconductor device in accordance with an example embodiment.

DETAILED DESCRIPTION OF THE EXAMPLE EMBODIMENTS

Figure 1:
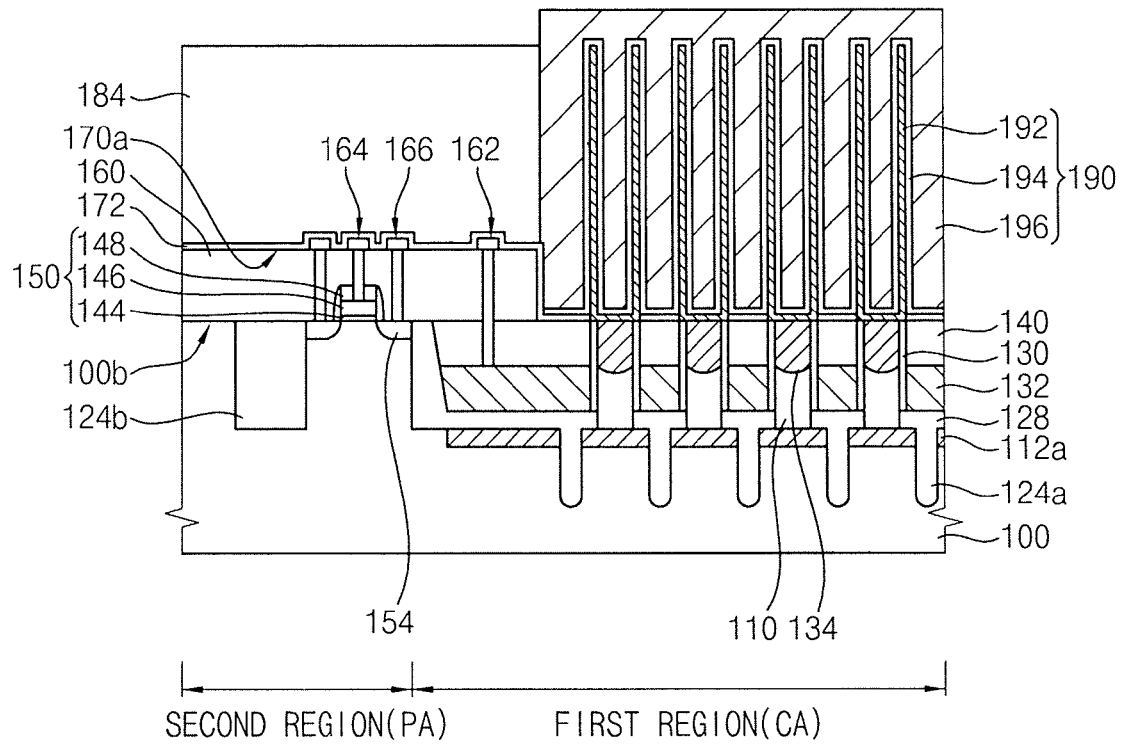

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a cross-sectional view illustrating a semiconductor device in accordance with an example embodiment.

Referring to FIG. 1, a semiconductor device includes a substrate 100 having a first region (CA) and a second region (PA), a first transistor in the first region (CA), a second transistor in the second region (PA) and a capacitor 190 electrically connected to the first transistor.

The substrate 100 may be a semiconductor substrate such as, for example, a silicon substrate or a germanium substrate, a SOI (silicon-on-insulator) substrate, a GOI (germanium-on-insulator) substrate, etc. The first region (CA) of the substrate 100 may include a cell region where memory cells are formed and the second region (PA) may include a peripheral region where logic cells are formed.

A first isolation layer pattern 124a is provided in the first region (CA) of the substrate 100 and a second isolation layer pattern 124b is provided in the second region (PA) of the substrate 100. Accordingly, the substrate 100 may be divided into an active region and an isolation region. A bottom face of the first isolation layer pattern 124a in the first region (CA) may be lower than a bottom face of the second isolation layer pattern 124b in the second region (PA). Hereinafter, the active region of the first region (CA) is referred to as a first active region and the active region of the second region (PA) is referred to as a second active region.

In an example embodiment, the first active region may have, for example, a linear shape extending in a first direction. An impurity region is provided under an upper surface of the substrate in the first active region. The impurity region may serve as a buried bit line 112a that connects bottom faces of pillars 110 arranged in the first direction.

The vertical pillars 110 are provided on the substrate 100 in the first active region. The pillars may be arranged repeatedly on the first active region of the linear shape. The pillar 110 may protrude upwardly from the substrate 100 in the first active region. The pillar 110 may have, for example, a shape of cylinder or a polygonal pillar. The width of the pillar 110 may be substantially identical to or smaller than the width of the first active region.

The bottom faces of the pillar 110 are lower than an upper surface 100b of the substrate 100 in the second region (PA). In an example embodiment, upper surfaces of the pillars 110 may be coplanar with the upper surface of the substrate 100 in the second region (PA). Alternatively, the upper surfaces of the pillars 110 may be higher or lower than the upper surface of the substrate 100 in the second region (PA).

An insulation layer pattern 128 is provided to cover the surface of the substrate 100 in the first region (CA) and to surround lower sidewalls of the pillars 110. The insulation layer pattern 128 insulates a first gate electrode 132 from the substrate 100 of the first region (CA).

A first gate insulation layer 130 is provided on a sidewall surface of the pillar 110. The first gate electrode 132 is provided on the first gate insulation layer 130 to have, for example, a linear shape extending in a second direction substantially perpendicular to the first direction. Accordingly, the first gate electrode 132 may be used as a common word line.

Upper portions of the pillars 110 protrude from the first gate electrode 132. An impurity region 134 is provided in the protruding upper portion of the pillar 110 to be used as a source or a drain. An insulation interlayer 140 is provided to fill gaps between the first gate electrodes 132 and between the silicon pillars 110.

Accordingly, vertical pillar transistors are provided in the pillars 110 in the first region (CA) of the substrate 100.

On the other hand, planar type transistors are provided on the upper surface of the substrate 100 in the second region (PA). The planar type transistor includes a second gate structure 150 having a second gate insulation layer pattern 144, a second gate electrode 146, a mask pattern 148 stacked on the surface of the substrate 100 in the second region (PA), and a source/drain 154 under the surface of the substrate 100 in both sides of the second gate structure 152.

Upper insulation interlayer pattern 160 is formed on the first region (CA) and the second region (PA) in the substrate 100. In an example embodiment, the upper insulation interlayer pattern 160 covers the planar type transistors in the second region (PA) and exposes the upper surfaces of the pillars 110 in the first region (CA). That is, the upper insulation interlayer pattern 160 has an opening that exposes the upper surfaces of the pillars 110 in the first region (CA). An upper surface 170a of the upper insulation interlayer pattern 160 in the second region (PA) may be higher than the upper surface of the pillar 110 in the first region (CA) of the substrate 100. That is, the upper surface 170a of the upper insulation interlayer pattern 170 in the second region (PA) may be higher than the upper surface of the impurity region 134 in the upper portion of the pillar 110 in the first region (CA).

A first wiring 162 is provided to penetrate the upper insulation interlayer pattern 160 to be electrically connected to an end portion of the first gate electrode 132 of the vertical pillar transistor. Second and third wirings 164 and 166 are provided to penetrate the upper insulation interlayer pattern 160 to be electrically connected to the second gate electrode 146 and the source/drain regions 154, respectively. The first, second and the third wirings 162, 164 and 155 may include a contact plug and a conductive line.

In an example embodiment, a capacitor may be provided to be electrically connected to the upper surface of the pillar 110 in the first region. The capacitor may include a lower electrode 192, a dielectric layer 194 on the lower electrode 192 and an upper electrode 196 on the dielectric layer 194. For example, the lower electrode 192 of the capacitor 190 may have a cylindrical shape.

The upper insulation interlayer pattern 160 exposes the upper surfaces of the pillars 110 in the first region (CA). Accordingly, the lower electrode 192 of the capacitor 190 directly contacts the impurity region 134 in the upper portion of the pillar 110. As the upper surfaces of the pillars 110 are exposed by the upper insulation interlayer pattern 160, the entire outer surface including an outer lower surface of the lower electrode 192 is exposed. Because the dielectric layer 194 is formed on the entire outer surface of the exposed lower electrode 192, a node height of the capacitor 190 is increased, to thereby improve the capacitance of a resultant capacitor.

Thus, a DRAM cell including the vertical pillar transistor and the capacitor 190 electrically connected to the impurity region 134 of the vertical pillar transistor is provided in the first region (CA) of the substrate 100. In this embodiment, the lower electrode 192 of the capacitor 190 may directly contact and be connected to the impurity region 134 without a self-aligned contact (SAC) or a buried contact (BC).

The upper surface of the impurity region 134 of the vertical pillar transistor in the first region (CA) is lower than the upper surface 170a of the upper insulation layer pattern 160 covering the planar type transistors in the second region (PA). Accordingly, the entire outer surface of the lower electrode 192 connected to the impurity region 134 is exposed and the dielectric layer 194 is formed on substantially the entire or the entire outer surface including the outer lower surface of the lower electrode 192, to increase the height of the capacitor 190 substantially and provide an improved capacitance.

Hereinafter, a method of manufacturing the semiconductor device will be explained.

FIGS. 2 to 13 are cross-sectional views illustrating a method of manufacturing a semiconductor device in accordance with an example embodiment.

Figure 2:
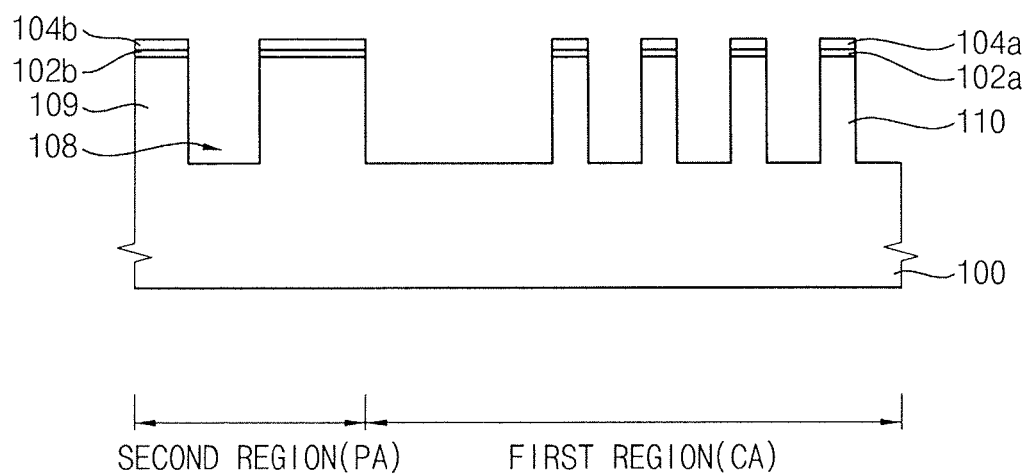

Referring to FIG. 2, a substrate 100 having a first region (CA) and a second region (PA) is prepared. The substrate 100 may be a semiconductor substrate such as, for example, a silicon substrate or a germanium substrate, a SOI (silicon-on-insulator) substrate, a GOI (germanium-on-insulator) substrate, etc. The first region (CA) of the substrate 100 may include a cell region where memory cells are formed and the second region (PA) may include a peripheral region where logic cells are formed.

A pad oxide layer and a first mask layer are sequentially formed on the substrate 100. For example, the pad oxide layer may be formed using silicon oxide by a thermal oxidation process or a chemical vapor deposition process. The first mask layer may be formed, for example, using silicon nitride or silicon oxynitride by a chemical vapor deposition process.

A first photoresist pattern is formed on the first mask layer. The first mask layer is patterned using the first photoresist pattern as an etching mask to form a first mask pattern 104a in the first region (CA) on the substrate and a second mask pattern 104b in the second region (PA) on the substrate 100. The first photoresist pattern is removed from the substrate 100 by, for example, ashing and strip processes.

In an example embodiment, the first mask pattern 104a may have, for example, a cross-sectional shape of a circle or a polygon. The second mask pattern 104b may have, for example, a bar shape extending in a first direction.

The pad oxide layer and the substrate 100 are partially etched using the first and second mask patterns 104a and 104b as etching masks to form a first pad oxide layer pattern 102a and a first upper pattern or vertical pillar 110 in the first region (CA) and to form a second pad oxide layer pattern 102b and a second upper pattern 109 in the second region (PA).

As a portion of the substrate 100 in the second region (PA) is etched using the second mask pattern 104b to form the second upper pattern 109, a second isolation trench 108 is formed in the second region (PA) of the substrate 100 to define the second upper pattern 109. By forming the second isolation trench 108, the second region (PA) of the substrate 100 is divided into an active region and an isolation region. Accordingly, a second active structure including the second upper pattern 109 defined by the second isolation trench 108 is formed in the second region (PA).

For example, the first and second upper patterns 110 and 109 may be formed by an anisotropic etch process. In an example embodiment, the first upper pattern 110 may have, for example, a shape of cylinder or a polygonal pillar corresponding to the cross-sectional shape of the first mask pattern 104a. The second upper pattern 109 may have, for example, a bar shape extending in a direction parallel with the first direction corresponding to the cross-sectional shape of the second mask pattern 104b. The second upper pattern 109 may have a width substantially greater than that of the first upper pattern 110.

Figure 3:
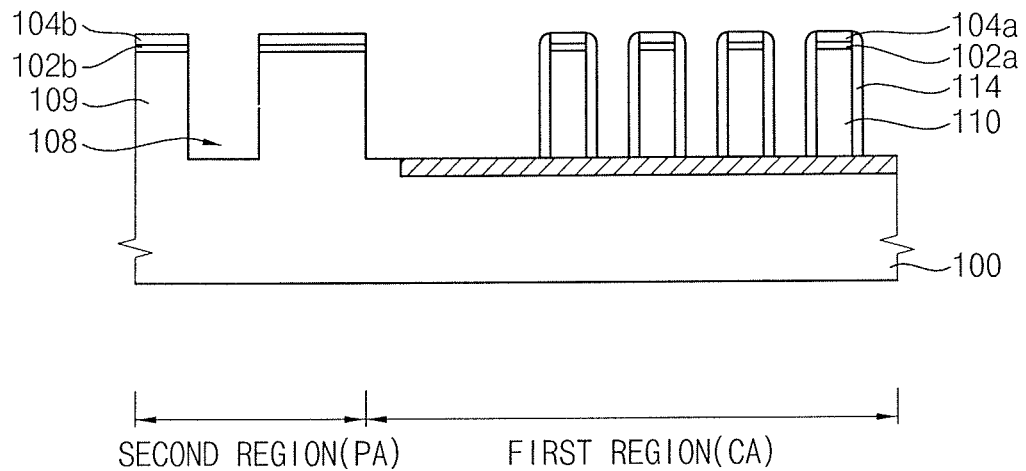

Referring to FIG. 3, impurities are implanted into the first region (CA) of the substrate 100 adjacent to the first upper pattern 110 to form a preliminary impurity region 112. The preliminary impurity region 112 may include P-type or N-type impurities. For example, the preliminary impurity region 112 may include P-type impurities such as boron (B) and indium (In) or N-type impurities such as phosphorous (P) and arsenic (As).

Then, a third mask pattern 114 is formed on sidewalls of the first mask pattern 104 and the first upper pattern 110. The third mask pattern 114 may have, for example, a bar shape extending in a direction substantially parallel with the first direction and surrounding the first upper pattern 110. For example, the third mask pattern 114 may be formed using nitride such as silicon nitride or oxynitride such as silicon oxynitride.

In an example embodiment, after a third mask layer is formed along a profile of the first mask pattern 104a and the first upper pattern 110, the third mask layer may be etched by, for example, an anisotropic etch process to form the third mask pattern 114 surrounding the first upper pattern 110. At this time, a fourth mask pattern may be formed to surround the second upper pattern 109, but the process for forming the fourth mask pattern may be omitted for simplicity. In this case, a fourth mask layer is formed on the second region (PA) of the substrate 100 to cover the entire second region (PA) of the substrate 100.

Figure 4:
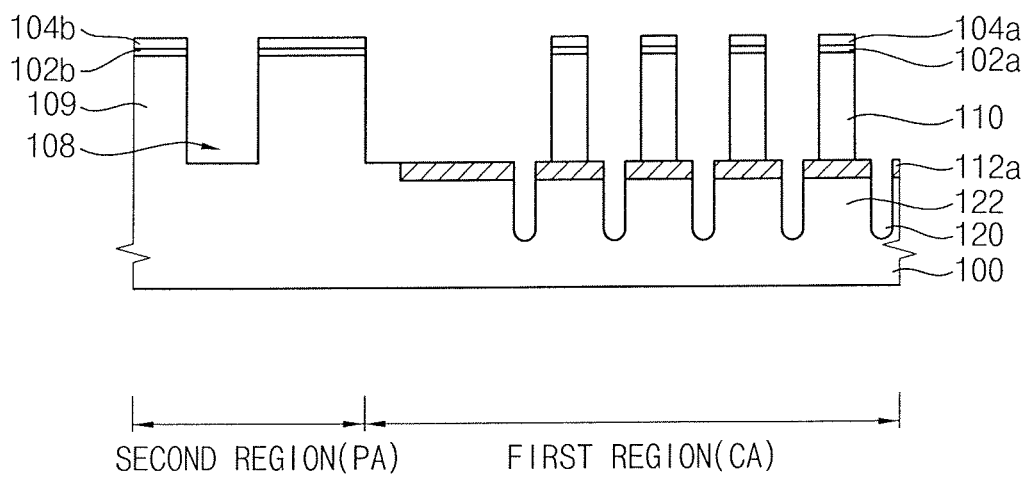

Referring to FIG. 4, a portion of the substrate 100 in the first region (CA) is etched using the first and third mask patterns 104a and 114 as an etching mask to form a first isolation trench 120 in the first region (CA) of the substrate 100. In an example embodiment, the portion of the substrate 100 in the first region (CA) may be removed by, for example, an anisotropic etch process. In this case, the substrate 100 in the second region (PA) covered by the second mask pattern 104b and the fourth mask layer may be not removed by the anisotropic etch process.

Accordingly, the preliminary impurity region 112 is partially removed to form a buried bit line 112a. The buried bit lines 112a may be spaced apart from one another by the first isolation trench 120 interposed between the buried bit lines 112a. By forming the first isolation trench 120, the first region (CA) of the substrate 100 is divided into an active region and an isolation region.

Accordingly, a first active structure including a first lower pattern 122 and the first upper pattern 110 on the first lower pattern 122 is formed in the first region (CA). The first lower pattern 122 is defined by the first isolation trench 120. The first lower pattern 122 may extend in a direction substantially parallel with the first direction in the first region (CA) of the substrate 100 corresponding to the shape of the third mask pattern 114. The first lower pattern 122 may have a width substantially greater than that of the first upper pattern 110.

Then, the fourth mask layer is removed from the second region (PA). For example, the fourth mask layer may be removed by a wet etch process to prevent the surface damage of the substrate 100.

In an example embodiment, after the first upper pattern, that is, a vertical pillar 110 is formed on the substrate 100 in the first region (CA), the first isolation trench 120 and the buried bit line 112a may be formed in the first region (CA).

Alternatively, after the isolation layer pattern and the buried bit line are formed in the substrate, the single crystal of the substrate 100 may be grown using the substrate 100 as a seed to form a single-crystalline silicon pillar. In this case, the single-crystalline silicon pillar may be formed by, for example, a selective epitaxial growth process, a laser-induced epitaxial growth process, etc.

Figure 5:
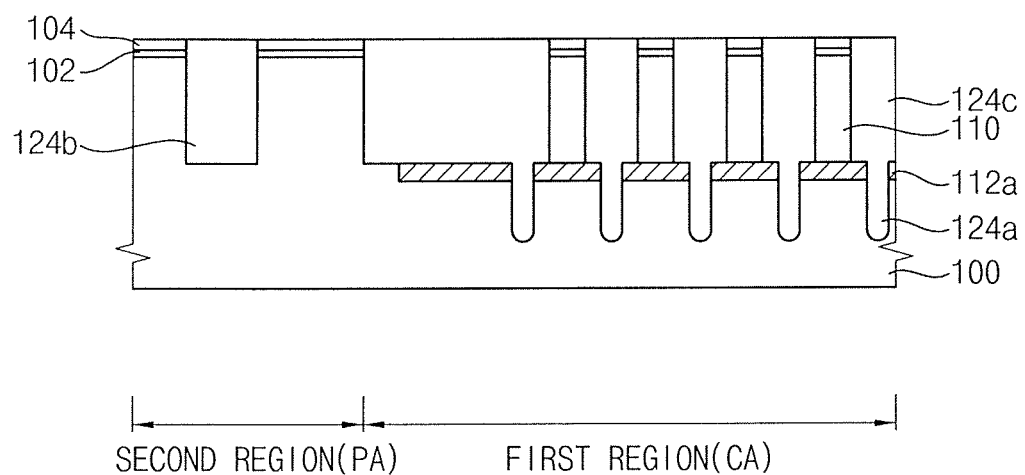

Referring to FIG. 5, an insulation layer is formed to cover the first and second mask patterns 104a and 104b and the first and second active structures. The insulation layer fills up the first isolation trench 120, a gap between the pillars 110 in the first region (CA) and the second isolation trench 108. Then, the insulation layer is planarized until upper surfaces of the first and second mask patterns 104a and 104b are exposed.

The insulation layer may be formed using, for example, silicon oxide having beneficial gap-fill characteristics. The insulation layer is formed to sufficiently fill between the adjacent first active structures in the first region (CA) and between the adjacent second active structures in the second region (PA).

Accordingly, a first isolation layer pattern 124a and a second isolation layer pattern 124b are formed in the first isolation trench 120 and the second isolation trench 109, respectively. A first insulation layer pattern 124c is formed between the adjacent pillars 110 in the first region (CA).

Figure 6:
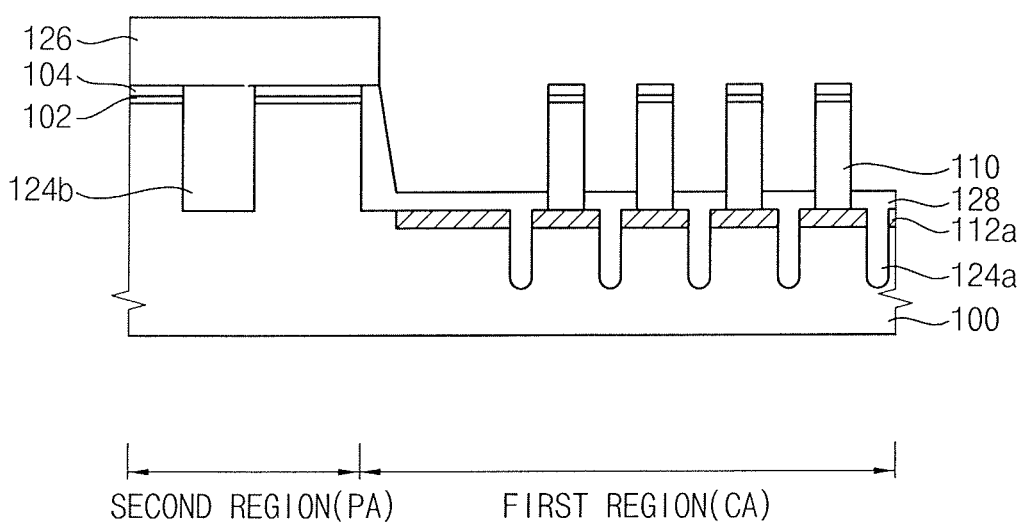

Referring to FIG. 6, a second photoresist pattern 126 is formed on the second isolation layer pattern 124b and the second mask pattern 104b. The second photoresist pattern 126 may expose the first region (CA) and cover the entire second region (PA).

An upper portion of the first insulation layer pattern 124c is etched using the second photoresist pattern 126 as an etching mask to form a second insulation layer pattern 128 on the substrate 100 of the first region (CA). For example, the first insulation layer pattern 124c may be etched by a wet etch process.

Accordingly, as the portion of the first insulation layer pattern 124c is etched, a sidewall of the first upper pattern, that is, the vertical pillar 110 is exposed. The second insulation layer pattern 128 surrounds a lower sidewall of the pillar 110. The pillar 110 penetrates the second insulation layer pattern 128 such that an upper portion of the pillar protrudes from the second insulation layer pattern 124c. Thus, the second insulation layer pattern 128 may insulate the substrate 100 of the first region (CA) from a gate electrode of a vertical pillar transistor to be formed by a following process.

Then, the second photoresist pattern 126 may be removed by, for example, ashing and strip processes.

Figure 7:
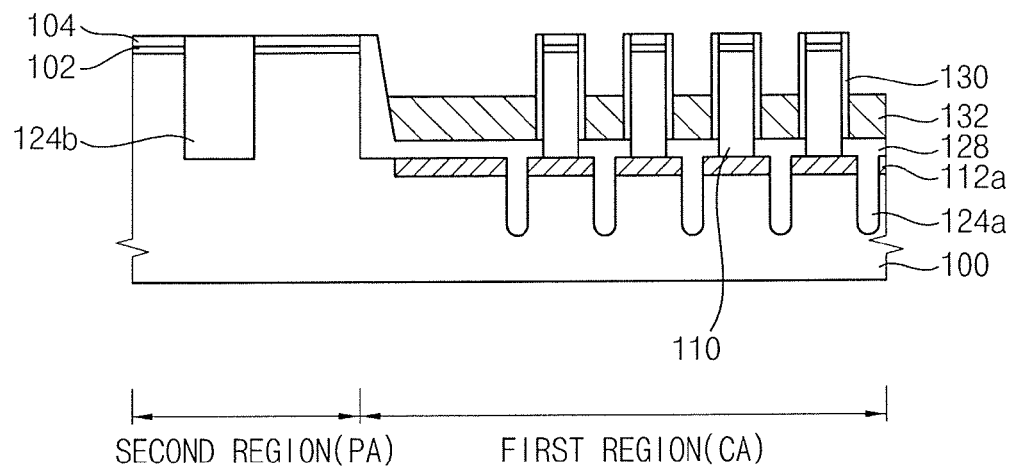

Referring to FIG. 7, a first gate insulation layer 130 is formed on the exposed surface of the pillar 110. The exposed surface of the pillar 110 may be, for example, thermally oxidized to form the first gate insulation layer 130. Alternatively, the first gate insulation layer 130 may be formed using, for example, silicon oxide by a chemical vapor deposition process.

A preliminary conductive layer for a gate electrode is formed on the second insulation layer pattern 128 and on the first gate insulation layer 130. The preliminary conductive layer for a gate electrode may be formed using, for example, polysilicon or a metal material. For example, the preliminary conductive layer for a gate electrode may include polysilicon, tungsten (W), tungsten nitride (WNx), tungsten silicide (WSix), tantalum (Ta), tantalum nitride (TaNx), tantalum silicide (TaSix), aluminum (Al), aluminum nitride (AlNx), etc.

Then, after the preliminary conductive layer for a gate electrode is planarized, an upper portion of the preliminary conductive layer for a gate electrode is partially etched such that the thickness of the preliminary conductive layer for a gate electrode is decreased to expose the upper portion of the pillar 110. The upper portion of the preliminary conductive layer may be removed by, for example, a dry etch process or a wet etch process. Thus, a conductive layer for a gate electrode is formed in the first region (CA). The upper surface height of the conductive layer may be lower than the upper surface height of the substrate 100 in the second region (PA).

Then, the conductive layer for a gate electrode is patterned to form a first gate electrode 132. In particular, a third photoresist pattern is formed on the substrate 100 having the conductive layer formed thereon. The third photoresist pattern on the first region (CA) may have, for example, a linear shape extending in a second direction substantially perpendicular to the first direction. The third photoresist pattern may cover the pillars 110 that are arranged in the second direction in the first region (CA). Additionally, the third photoresist pattern may cover all the layers that are formed in the second region (PA).

The conductive layer is etching using the third photoresist pattern as an etching mask to form a first gate electrode 132. The first gate electrode 132 may surround the pillars 110. The first gate electrode 132 may have, for example, a linear shape extending in the second direction. Accordingly, the first gate electrode 132 may be used as a word line.

Then, the third photoresist pattern is removed by, for example, ashing and strip processes.

Figure 8:
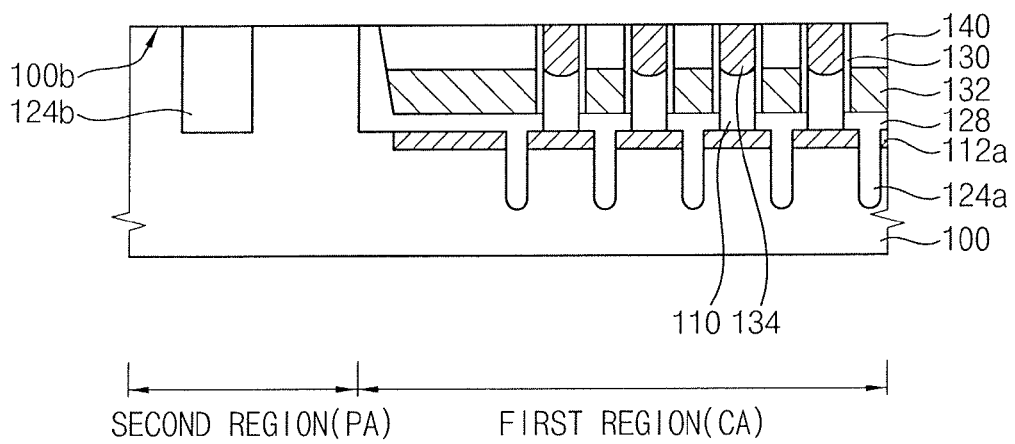

Referring to FIG. 8, an insulation interlayer 140 is formed to fill gaps between the first gates 132 and between the pillars 110. For example, the insulation interlayer 140 may be formed using oxide.

In an example embodiment, an upper portion of the insulation interlayer 140 may be partially removed until the first mask pattern 104a is exposed such that the upper portion of the insulation interlayer 140 is planarized. For example, the insulation interlayer 140 may be planarized by a chemical mechanical polishing process and/or an etch-back process.

Then, impurities are implanted into the upper portion of the pillar 110 that is exposed through the insulation interlayer 140 as the first mask pattern 104a and the first pad oxide layer pattern 102a are selectively removed from the pillar 110, to form an impurity region 134. The impurity region 134 may include P-type or N-type impurities. For example, the impurity region 134 may include P-type impurities such as boron and indium or N-type impurities such as phosphorous and arsenic.

By performing the above-processes, vertical pillar transistors are formed in the first region (CA) of the substrate 100.

Then, the second hard mask pattern 104ab and the second pad oxide layer pattern 102b are selectively removed. By performing the process, the upper surface of the second isolation layer pattern 124b may be partially etched, and thus, the upper surface 100b of the substrate 100 in the second region (PA) is exposed.

Figure 9:
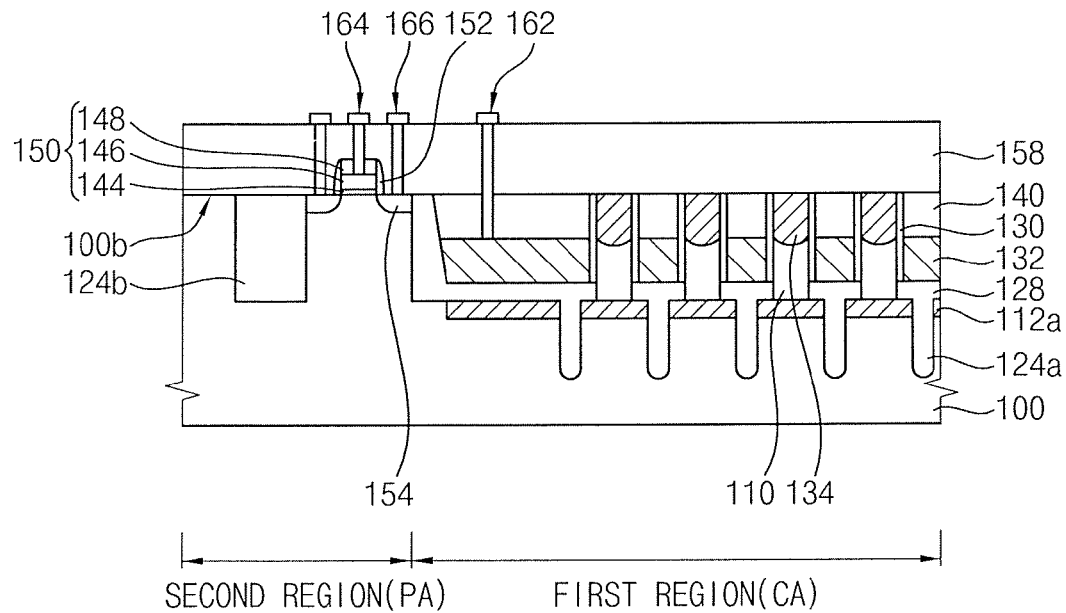

Referring to FIG. 9, a second gate insulation layer, a conductive layer and a third mask pattern 1438 are formed on the substrate 100 in the second region (PA). The conductive layer and the second gate insulation layer are etched using the third mask pattern 148 as an etching mask to form a second gate structure 150 including a second gate insulation layer pattern 144, a second gate electrode 146 and a third mask pattern 148. A spacer 152 is formed on both sidewalls of the second gate structure 150. Impurities are doped into the surface of the substrate 100 in both sides of the second gate structure 150 in the second region (PA) to form a source/drain region 154, to complete a planar type transistor in the second region (PA) of the substrate 100.

Then, an upper insulation interlayer 158 is formed on the substrate 100 to cover the vertical pillar transistors in the first region (CA) and the planar type transistors in the second region (PA). A first wiring 162 is formed to penetrate the upper insulation interlayer 158 to be electrically connected to the first gate electrode 132 of the vertical pillar transistor. Second and third wirings 164 and 166 are formed to penetrate the upper insulation interlayer 158 to be electrically connected to the second gate electrode 146 and the source/drain regions 154, respectively. The first, second and the third wirings 162, 164 and 155 may include a contact plug and a conductive line.

Figure 10:
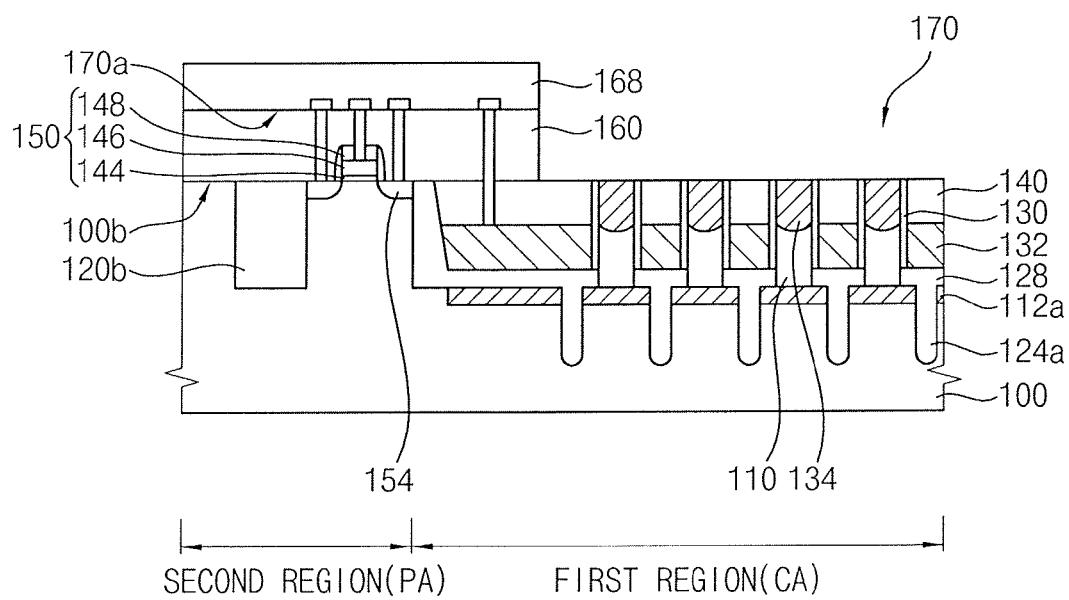

Referring to FIG. 10, a fourth photoresist pattern 168 is formed on the substrate 100 to cover the second region (PA) and expose the first region (CA) where the pillars 110 are formed.

The upper insulation interlayer 158 in the first region (CA) is etched using the fourth photoresist pattern 168 as an etching mask to form an upper insulation interlayer pattern 160 having an opening 170 in the first region (CA) of the substrate 100. For example, the upper insulation interlayer 158 may be etched by a wet etch process.

By performing the etch process, the upper insulation layer pattern 160 has an upper surface 170a in the second region (PA) higher than in the first region (CA). Accordingly, the opening 170 is defined by a higher step of the upper surface 170a of the upper insulation interlayer pattern 160 in the second region (PA).

In an example embodiment, the upper insulation interlayer pattern 160 may expose the upper surface of the pillars 110, that is, the impurity regions 134 in the upper portion of the pillars 110 in the first region (CA). The upper insulation interlayer pattern 160 may cover the planar type transistors in the second region (PA) of the substrate 100. The upper insulation interlayer pattern 160 may be formed in the second region (PA) to cover the second gate structures.

In an example embodiment, the upper insulation interlayer pattern 160 in the second region (PA) may have the upper surface substantially higher than the upper surface of the pillar 110 formed in the first region (CA) of the substrate 100.

Then, the fourth photoresist pattern 168 is removed by, for example, ashing and strip processes.

Figure 11:
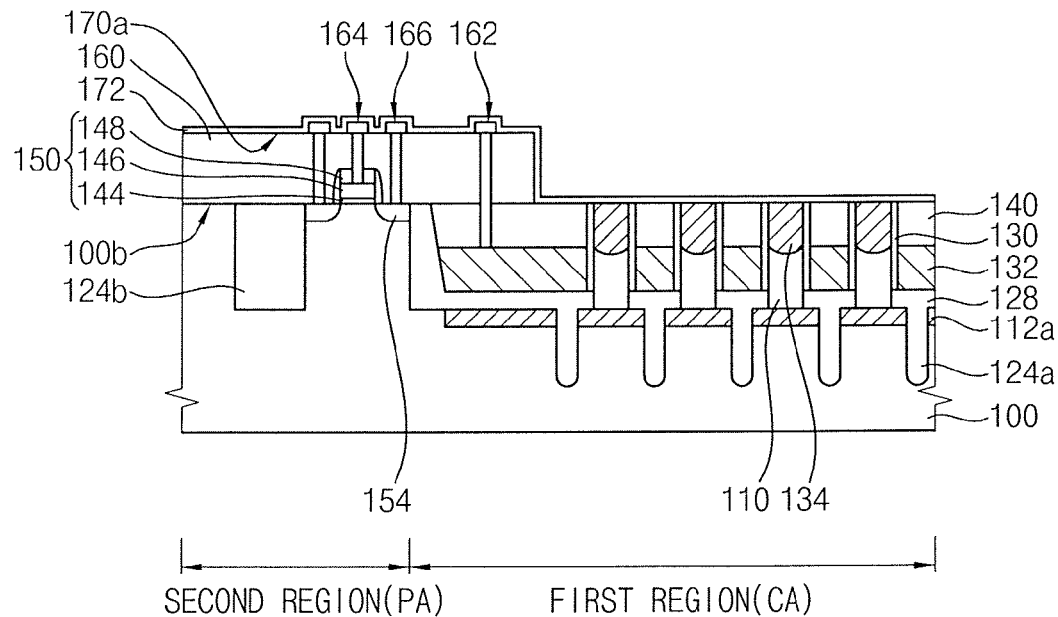

Referring to FIG. 11, an etch stop layer 172 is formed on the substrate 100. The etch stop layer 172 may be formed using, for example, an insulation material having nitride. For example, the etch stop layer 172 may be formed using silicon nitride. The etch stop layer 172 covers the upper insulation interlayer pattern 160 in the second region (PA). The etch stop layer 172 covers a portion in the first region (CA) exposed by the opening 170 of the upper insulation interlayer pattern 160.

Figure 12:
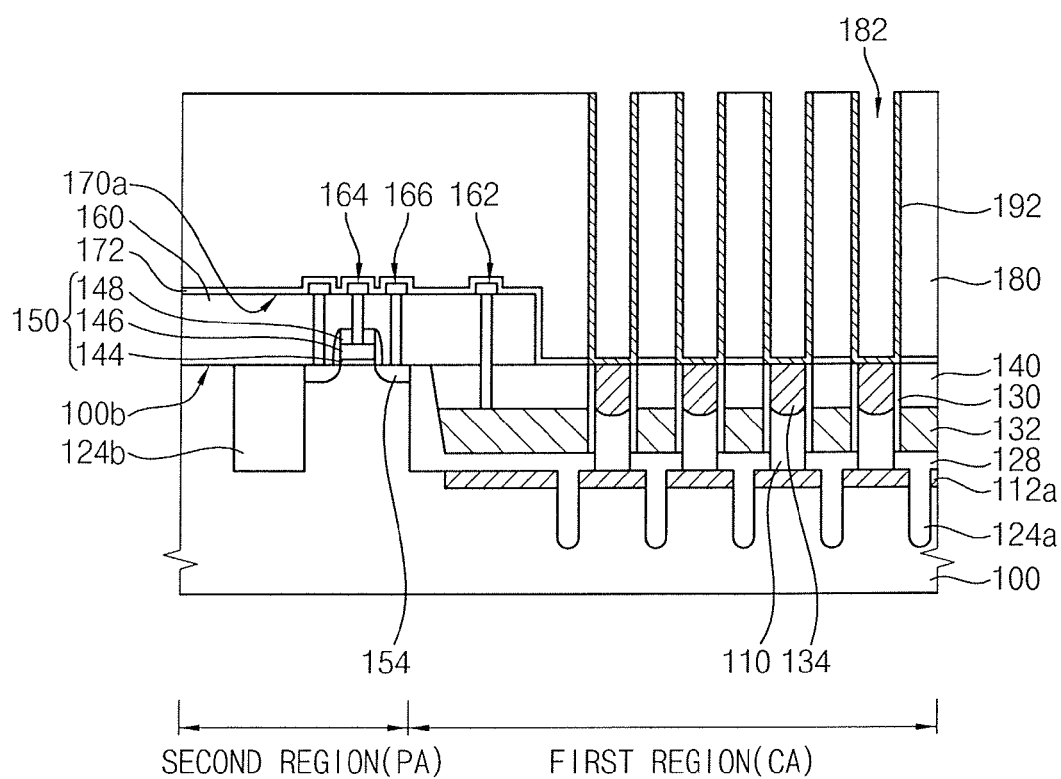

Referring to FIG. 12, a mold layer is formed on the etch stop layer 172. The mold layer may be used to form a lower electrode of a capacitor that contacts the upper surface of the pillar 110. For example, the mold layer may be formed using an insulation material having oxide. Examples of the oxide may include but are not limited to tetraethoxysilane (TEOS), a high-density plasma chemical vapor deposition (HDP-CVD) oxide, phosphosilicate glass (PSG), undoped silica glass (USG), borophoshosilicate glass (BPSG), spin-on-glass (SOG), etc.

The height of the lower electrode depends on a thickness of the mold layer. Accordingly, it may be understood that the thickness of the mold layer may be determined to meet a required capacitance of a resultant capacitor.

Then, the mold layer is patterned to form a mold layer pattern 180 having openings 182. The opening 182 defines a region for the lower electrode to be formed. The opening 182 exposes the upper surface of the pillar 110 formed on the substrate 100 in the first region (CA).

In an example embodiment, a mask layer may be formed on the mold layer using, for example, a material having an etch selectivity with respect to the mold layer, and then, a fifth photoresist pattern may be formed on the mask layer to define the regions for the lower electrodes to be formed. For example, the mask layer may be formed using nitride.

The mask layer may be etched using the fifth photoresist pattern as an etching mask to form a mask pattern that defines the regions for the lower electrodes to be formed. Then, the fifth photoresist pattern may be removed by, for example, ashing and strip processes. The mold layer may be partially etched using the mask pattern to form the mold layer pattern 180 that exposes the upper surfaces of the pillars 110.

After a conductive layer is formed on the exposed upper surface of the pillar 110, an inner face of the opening and the mask pattern, a sacrificial layer is formed on the conductive layer to fill the opening. For example, the conductive layer may be formed using polysilicon or metal. The sacrificial layer may be formed using, for example, silicon oxide.

Then, an upper portion of the sacrificial layer, a portion of the conductive layer on the mold layer pattern 180 and the mask pattern are removed from the substrate 100. For example, the upper portion of the sacrificial layer, the portion of the conductive layer and the mask pattern may be removed by a chemical mechanical polishing process, an etch-back process, etc.

The sacrificial layer in the opening 182 of the mold layer pattern 180 on the substrate 100 in the first region (CA) is removed. Accordingly, the conductive layer is formed on the inner face of the opening 182 to form a cylinder type lower electrode 192 that directly contacts the impurity region 134 in the upper portion of the pillar 110. Then, the mold layer pattern 180 is removed from the first region (CA) of the substrate 100. Thus, the entire outer surface of the lower electrode 192 contacting the impurity region 134 in the upper portion of the pillar 110 is exposed.

Figure 13:
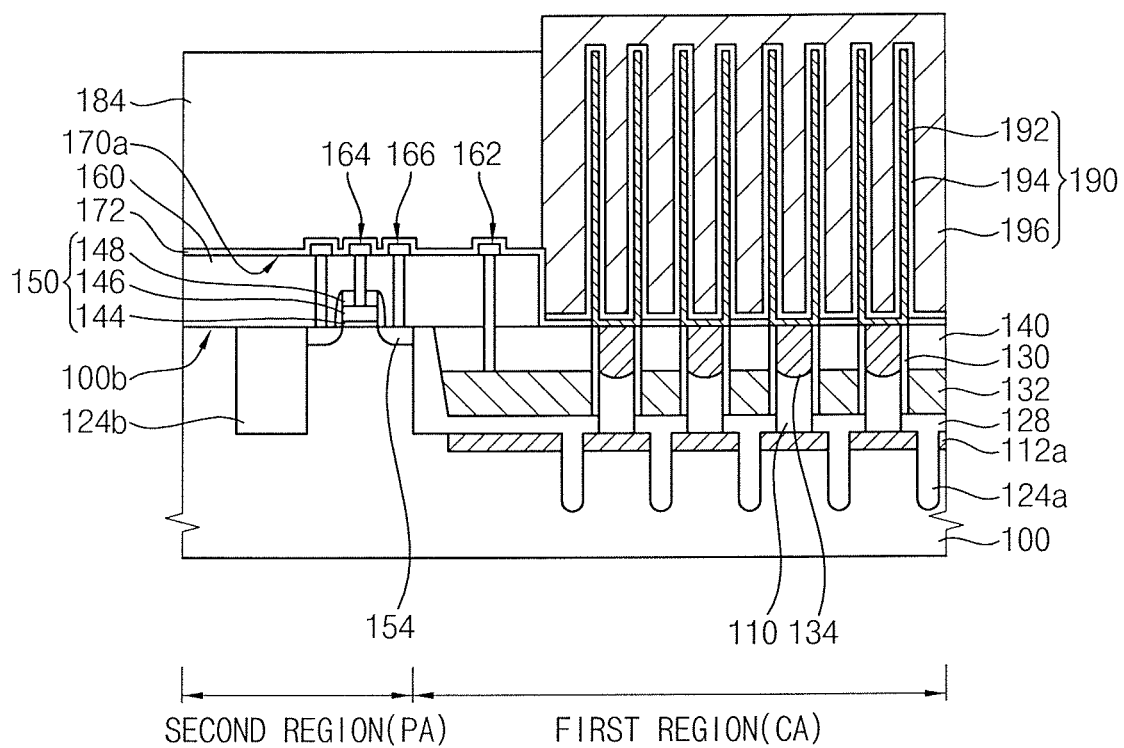

Referring to FIG. 13, a dielectric layer 192 is formed along a profile of the lower electrode 192. An upper electrode 196 is formed on the dielectric layer 194 to form a capacitor 190 that directly contacts the impurity region 134 in the upper portion of the pillar 110. In addition, a protective layer 184 may be formed on the second region (PA) of the substrate 100 to protect the planar type transistor.

In an example embodiment, the upper insulation interlayer pattern 160 covers the second gate structures in the second region (PA) and exposes the pillars 110 in the first region (CA). That is, the upper insulation interlayer pattern 160 has the opening 170 that exposes the upper surfaces of the pillars 110 in the first region (CA). The lower electrode 192 of the capacitor 190 directly contacts the impurity region 134 in the upper portion of the pillar 110.

Accordingly, as the mold layer pattern 180 is removed from the first region (CA) of the substrate 100, the entire outer surface including an outer lower surface of the lower electrode 192 is exposed. Because the dielectric layer 194 is formed on substantially the entire or the entire outer surface of the exposed lower electrode 192, a node height of the capacitor 190 is increased, to thereby improve a capacitance of a resultant capacitor.

As mentioned above, a semiconductor device includes a vertical pillar transistor in a first region of a substrate and a planar type transistor in a second region of the substrate. The vertical transistor has a pillar in a first region of a substrate and an impurity region in an upper portion of the pillar. An insulation interlayer pattern is formed on the first and second regions to cover the planar type transistor in the second region and expose an upper surface of the pillar in the first region. The upper insulation interlayer pattern has an upper surface substantially higher than the upper surface of the pillar.

A lower electrode directly contacts the impurity region in the exposed pillar, and a dielectric layer is formed on the entire outer surface of the lower electrode. An upper electrode is formed on the dielectric layer to form a capacitor that is electrically connected to the impurity region. Accordingly, the dielectric layer is formed on substantially the entire or the entire outer surface including an outer lower surface of the lower electrode, to thereby increase the height of the capacitor substantially and improve the capacitance of a resultant capacitor.

Having described the example embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor device, comprising:
    preparing a substrate having a first region and a second region;
    forming a pillar protruding upwardly from the substrate in the first region;
    forming a first transistor having an impurity region in an upper portion of the pillar;
    forming a second transistor in the second region of the substrate;
    forming an insulation interlayer pattern on the first region and the second region to cover the second transistor in the second region and expose an upper surface of the pillar in the first region through an opening in the insulation interlayer pattern, the insulation interlayer pattern having an upper surface in the second region which is substantially higher than an upper surface of the impurity region in the upper portion of the pillar in the first region; and
    forming a capacitor which is electrically connected to the impurity region of the first transistor in the first region of the substrate,
    wherein the forming of the capacitor comprises:
    forming a lower electrode directly contacting the impurity region in the upper portion of the pillar exposed by the insulation interlayer pattern;
    forming a dielectric layer on an entire outer surface of the lower electrode; and
    forming an upper electrode on the dielectric layer,
    wherein the upper surface of the insulation interlayer pattern in the second region is substantially higher than a lower surface of the lower electrode of the capacitor.

2. The method of claim 1, wherein an upper surface of the impurity region of the first transistor is substantially coplanar with an upper surface of the substrate in the second region.

3. The method of claim 1, wherein the forming of the insulation interlayer pattern comprises:
    forming an insulation interlayer on the first region and the second region to cover the first transistor and the second transistor; and
    patterning the insulation interlayer to form the insulation interlayer pattern having the opening that selectively exposes a portion of the first region where the pillar is formed.

4. The method of claim 1, further comprising:
    forming a first trench isolation layer pattern and a second trench isolation layer pattern in the first region and the second region, respectively.

5. The method of claim 1, wherein the forming of the first transistor comprises:
    forming the pillar protruding upwardly from the substrate in the first region;
    forming a first gate insulation layer on a sidewall of the pillar;
    forming a first gate electrode on the first gate insulation layer; and
    forming the impurity region in the upper portion of the pillar.

6. The method of claim 4, wherein the forming of the pillar comprising:
    growing a single-crystalline silicon pillar upwardly from the substrate in the first region.

7. The method of claim 5, wherein the single-crystalline silicon pillar is formed by one of a selective epitaxial growth process or a laser-induced epitaxial growth process.

8. The method of claim 4, wherein the pillar is arranged in a first direction and the first gate extends in a second direction different from the first direction.

9. The method of claim 1, further comprising:

implanting impurity ions into the surface of the substrate in the first region to form a buried bit line.

* * * * *